US009843756B2

(12) United States Patent
Wang et al.

(10) Patent No.: US 9,843,756 B2
(45) Date of Patent: Dec. 12, 2017

(54) IMAGING DEVICES, ARRAYS OF PIXELS RECEIVING PHOTOCHARGES IN BULK OF SELECT TRANSISTOR, AND METHODS

(71) Applicant: Samsung Electronics Co., Ltd., Suwon-si, Gyeonggi-do (KR)

(72) Inventors: Yibing Michelle Wang, Temple City, CA (US); Kwanghyun Lee, Hwaseong-si (KR); Hongyu Wang, San Gabriel, CA (US); Taechan Kim, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 121 days.

(21) Appl. No.: 14/723,427

(22) Filed: May 27, 2015

(65) Prior Publication Data

US 2016/0353042 A1    Dec. 1, 2016

(51) Int. Cl.
*H04N 5/374* (2011.01)
*H04N 5/3745* (2011.01)
*H04N 5/378* (2011.01)
*H01L 27/146* (2006.01)

(52) U.S. Cl.
CPC ......... *H04N 5/378* (2013.01); *H01L 27/1461* (2013.01); *H01L 27/14603* (2013.01); *H01L 27/14612* (2013.01); *H01L 27/14614* (2013.01); *H04N 5/3742* (2013.01); *H04N 5/3745* (2013.01)

(58) Field of Classification Search
CPC .... H04N 5/378; H04N 5/3742; H04N 5/3745; H01L 27/1461; H01L 27/14612; H01L 27/14614; H01L 27/14603
See application file for complete search history.

(56) References Cited

U.S. PATENT DOCUMENTS

| 5,285,091 | A | * | 2/1994 | Hamasaki | ......... | H01L 27/14654 |
| | | | | | | 257/230 |
| 6,693,670 | B1 | | 2/2004 | Stark | | |
| 7,139,025 | B1 | | 11/2006 | Berezin | | |
| 7,190,398 | B1 | | 3/2007 | Yadid-Pecht et al. | | |
| 7,488,928 | B2 | | 2/2009 | Krymski | | |
| 7,659,925 | B2 | | 2/2010 | Krymski | | |
| 7,746,400 | B2 | | 6/2010 | Mo | | |
| 7,812,878 | B2 | | 10/2010 | Kudoh | | |

(Continued)

FOREIGN PATENT DOCUMENTS

WO    2012064190 A1    5/2012

OTHER PUBLICATIONS

Caulfield, John T. et al., "Spatial oversampling in imaging sensors: benefits in sensitivity and detection," Applied Imagery Pattern Recognition Workshop (AIPR), 2012 IEEE.

(Continued)

*Primary Examiner* — Daniel M Pasiewicz
(74) *Attorney, Agent, or Firm* — Renaissance IP Law Group LLP

(57) ABSTRACT

In some embodiments, an imaging device includes a pixel array. At least one of the pixels includes a photodiode that can generate charges, and a select transistor that receives the charges in its bulk. When the select transistor is selected, a pixel current through it may depend on a number of the received charges, thus evidencing how much light it detected. A reset transistor may reset the voltage of the bulk.

7 Claims, 25 Drawing Sheets

(56) References Cited

U.S. PATENT DOCUMENTS

| | | | |
|---|---|---|---|
| 7,855,740 B2 | 12/2010 | Hamilton et al. | |
| 7,884,871 B2 | 2/2011 | Smith et al. | |
| 7,920,190 B2 | 4/2011 | Moholt et al. | |
| 7,924,332 B2 | 4/2011 | Gruev et al. | |
| 8,072,527 B2 | 12/2011 | Kusuda | |
| 8,325,260 B2 | 12/2012 | Yamazaki et al. | |
| 8,928,792 B1* | 1/2015 | Hynecek | H04N 5/3591 348/308 |
| 8,946,845 B1* | 2/2015 | Hynecek | H01L 27/1461 250/208.1 |
| 9,106,858 B2* | 8/2015 | Jin | H04N 5/3745 |
| 2005/0051808 A1* | 3/2005 | Hynecek | H01L 27/14609 257/225 |
| 2005/0156264 A1* | 7/2005 | Sakano | H01L 27/14609 257/432 |
| 2005/0194655 A1* | 9/2005 | Sakano | H01L 27/14654 257/462 |
| 2008/0290382 A1* | 11/2008 | Hirota | H01L 27/14627 257/291 |
| 2009/0014628 A1* | 1/2009 | Sakano | H01L 27/14609 250/208.1 |
| 2009/0153708 A1* | 6/2009 | Hirota | H01L 27/14629 348/294 |
| 2011/0128425 A1 | 6/2011 | Schemmann et al. | |
| 2012/0175497 A1* | 7/2012 | Hynecek | G01J 1/44 250/208.1 |
| 2013/0020469 A1 | 1/2013 | Okura et al. | |
| 2013/0057743 A1 | 3/2013 | Minagawa et al. | |
| 2013/0063631 A1* | 3/2013 | Fujiki | H01L 27/14612 348/294 |
| 2013/0194445 A1 | 8/2013 | Brown et al. | |
| 2013/0308031 A1 | 11/2013 | Theuwissen | |
| 2014/0014817 A1 | 1/2014 | Motonaga et al. | |
| 2014/0375855 A1* | 12/2014 | Nishihara | H01L 27/14603 348/301 |

OTHER PUBLICATIONS

Hamamoto, T. et al., "Column Parallel A/D Conversion on CMOS Image Sensor," IEEE CCD and AIS 1 (2001): 165-168.

Oike, Y. et al., "A CMOS Image Sensor for High-Speed Active Range Finding Using Column-Parallel Time-Domain ADC and Position Encoder," IEEE Transactions on Electron Devices, v 50, n 1, 152-8, Jan. 2003; ISSN: 0018-9383; DOI: 10.1109/TED.2002. 806967; Publisher: IEEE, USA Jan. 31, 2003.

Sbaiz, Luciano et al., "The Gigavision Camera," ICASSP 2009, pp. 1093-1096.

Treis, J. et al., "Advancements in DEPMOSFET device developments for XEUS," http://twiki.hll.mpg.de/07_publication/2006/ spie_6276_10.pdf Proc. SPIE 6276, High Energy, Optical, and Infrared Detectors for Astronomy II, 627610 (Jun. 15, 2006); doi:10.1117/12.672029 Jun. 15, 2006, 12 pages.

Yeh, Shang-Fu et al., "A New CMOS Image Sensor Readout Structure for 3D Integrated Imagers," Custom Integrated Circuits Conference (CICC), 2011 IEEE, vol., no., pp. 1,4, Sep. 19-21, 2011 doi: 10.1109/CICC.2011.6055381 Sep. 21, 2011.

Yoon, HyungJune et al., "The Gigavision Camera A 2Mpixel Image Sensor with 0.56!m2 1-T Digital Pixels," In N Teranisi, J Nakamura & S Kawahito (Eds.), 2011 International Image Sensor Workshop (IISW 2011) (pp. 1-4). Hokkaido, Japan: IISW.

* cited by examiner

*EQUATIONS*

[E7-1] $|V_{th}| = |V_{th0}| + \gamma\left(\sqrt{|2\phi_F + V_{pix} - V_{pd}|} - \sqrt{|2\phi_F|}\right)$

[E7-2] $I_{pix} = k_p \frac{W_p}{L_p}\left[(V_{pix} - rsel_{on} - |V_{th}|)(V_{pix} - V_{pixd}) - \frac{1}{2}(V_{pix} - V_{pixd})^2\right]$

[E7-3] $I_{int} = I_{pix} - I_{bias}$

[E7-4] $V_{int} = I_{int}/C_{int} \cdot t_{int}$

[E7-5] $V_{out} = C_{int}/C_{fb} \cdot V_{int}$

FIG. 7B

*EQUATIONS*

[E8-1] $|V_{th}| = |V_{th0}| + \gamma \left( \sqrt{|2\phi_F + V_{pix} - V_{pd}|} - \sqrt{|2\phi_F|} \right)$

[E8-2] $I_{pix} = k_p \frac{W_p}{L_p} \left[ (V_{pix} - rsel_{on} - |V_{th}|)(V_{pix} - V_{pixd}) - \frac{1}{2}(V_{pix} - V_{pixd})^2 \right]$

[E8-3] $I_{int} = I_{pix} - I_{bias}$

[E8-4] $V_{int} = I_{int} \cdot R_{int}$

[E8-5] $V_{out} = {c_m}/{c_{fb}} \cdot V_{int}$

FIG. 8B

EQUATIONS

[E9-1] $|V_{th}| = |V_{th0}| + \gamma\left(\sqrt{|2\phi_F + V_{pix} - V_{pd}|} - \sqrt{|2\phi_F|}\right)$

[E9-2] $I_{pix} = k_p \frac{W_p}{L_p}\left[\left((V_{pix} - rsel_{on} - |V_{th}|)(V_{pix} - V_{pixd}) - \frac{1}{2}(V_{pix} - V_{pixd})^2\right)\right]$

[E9-3] $V_{pixout} = I_{pix} \cdot R_{bias} = {I_{pix}}/{\lambda I_{bias}}$

[E9-4] $V_{out} = {c_{tn}}/{c_{fp}} \cdot V_{pixout}$

FIG. 9B

[E10-1] $|V_{th}| = |V_{th0}| + \gamma \left( \sqrt{|2\phi_F + V_{pix} - V_{pd}|} - \sqrt{|2\phi_F|} \right)$

[E10-2] $V_{pixout} = V_{rs} + |V_{th}|$

[E10-3] $\Delta V_{pixout} / \Delta V_{pd} \approx 0.1 \sim 0.2$

EQUATIONS

FIG. 10B

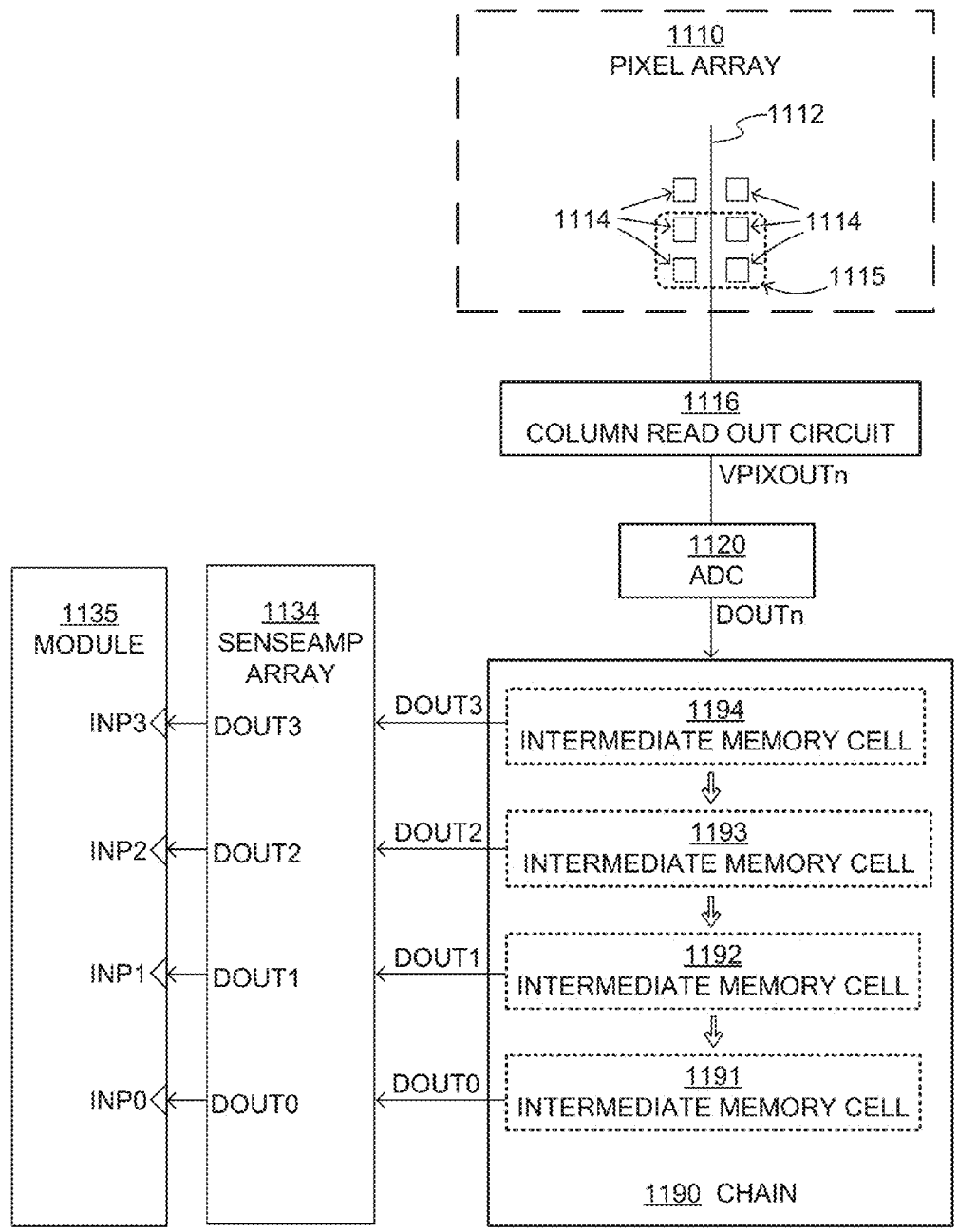
FIG. 11  *SAMPLE COMPONENTS*

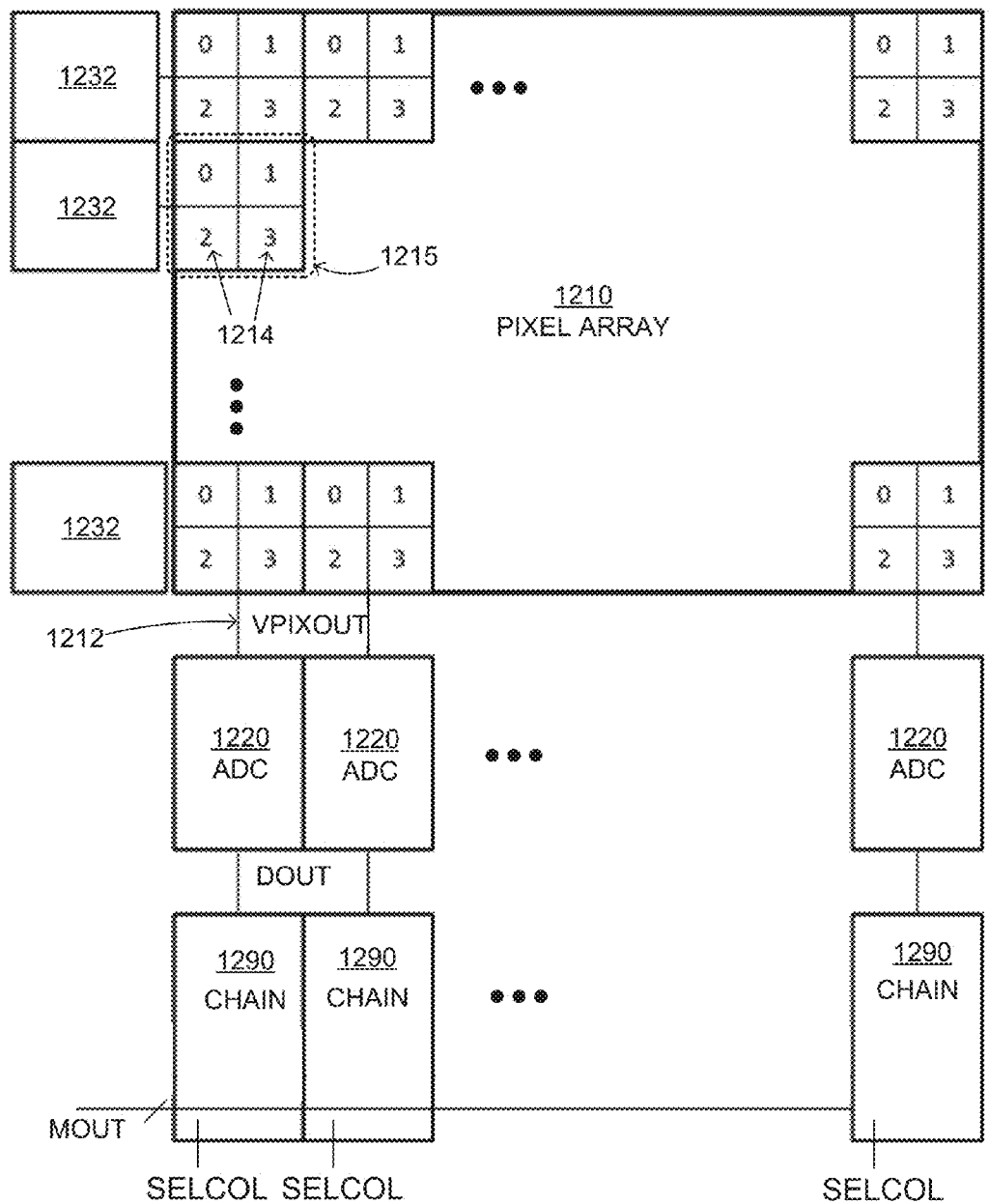
FIG. 12   SAMPLE COMPONENTS

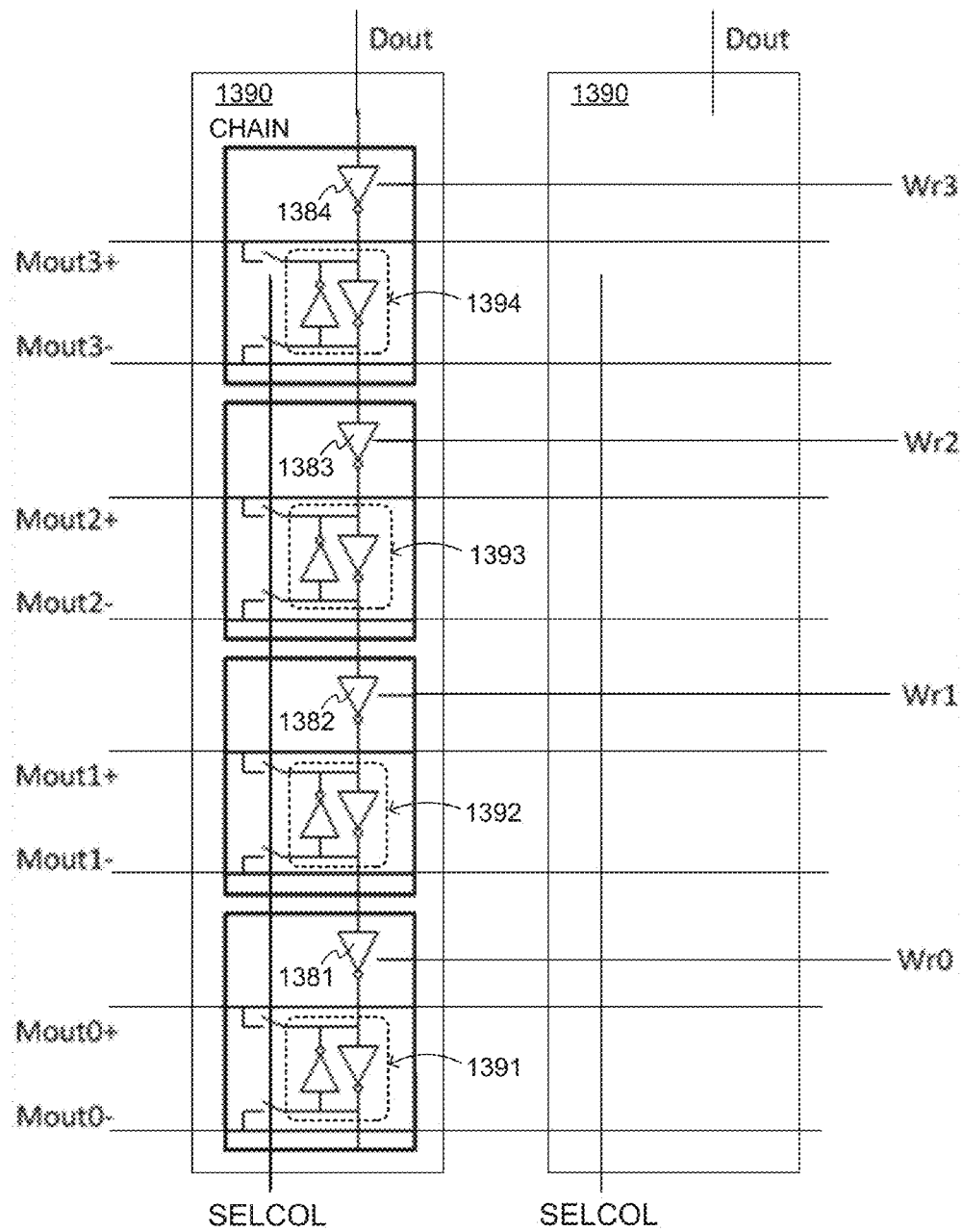
FIG. 13  *INTERMEDIATE MEMORY CELLS*

STORING IN DAISY-CHAINED CELLS

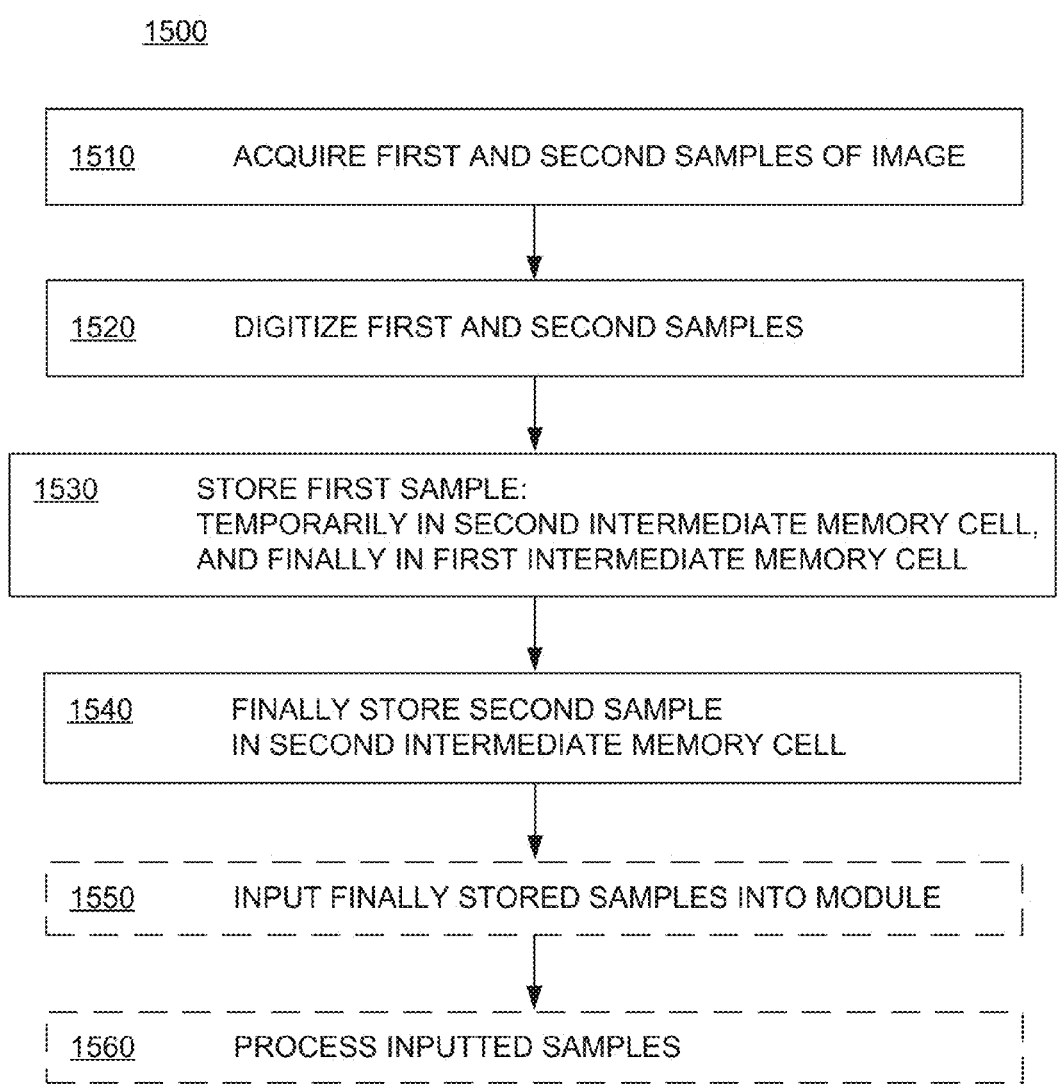
FIG. 15     *METHODS*

IMAGING DEVICES, ARRAYS OF PIXELS RECEIVING PHOTOCHARGES IN BULK OF SELECT TRANSISTOR, AND METHODS

BACKGROUND

Imaging devices, which are also known as cameras, are used for capturing images of a person, object or scene as desired. They can also be used for ranging, i.e. determining the distance of the person, object or scene from the imaging device.

Modern imaging devices use pixels to capture images. The pixels divide an input image in elements, and capture values for the elements of the image. These values for the image are captured by various techniques, such as numbers of electrons per pixel after a brief exposure time. The output image is typically constructed from the captured values, whether in color or in black and white.

BRIEF SUMMARY

The present description gives instances of imaging devices and methods, the use of which may help overcome problems and limitations of the prior art.

In some embodiments, an imaging device includes a pixel array. At least one of the pixels includes a photodiode that can generate charges, and a select transistor that receives the charges in its bulk. When the select transistor is selected, a pixel current through it may depend on a number of the received charges, thus evidencing how much light it detected. A reset transistor may reset the voltage of the bulk.

In some embodiments, an imaging device includes a pixel array. At least one of the pixels generates a pixel current with a magnitude in accordance with how much light it detected. A column read out circuit can be configured to generate an output voltage from the pixel current. It may include a current source configured to establish a bias current, and a current mirror configured to generate a mirrored bias current from the bias current. At least a part of the mirrored bias current can be at least a part of the carried pixel current. The pixel currents can be read out even though very small, and result in smaller power consumption.

In some embodiments, an imaging device includes a pixel array with rows and columns of pixels, and chains at the end of at least some of the columns. The chains have intermediate memory cells, where values read out of the pixels are stored. Then the chains may be read out to another module in parallel, which can facilitate post-processing. This way readout from the pixel array can be at high speed, which is additionally helpful with temporal and spatial oversampling.

These and other features and advantages of this description will become more readily apparent from the Detailed Description, which proceeds with reference to the associated drawings in which:

BRIEF DESCRIPTION OF THE DRAWINGS

FIG. 7B shows equations applicable for the circuit of FIG. 7A.

FIG. 8B shows equations applicable for the circuit of FIG. 8A.

FIG. 9B shows equations applicable for the circuit of FIG. 9A.

FIG. 10B shows equations applicable for the circuit of FIG. 10A.

FIG. 11 is a diagram of sample components of an imaging device that includes at least one chain of intermediate memory cells according to embodiments.

FIG. 12 is a diagram of sample components of an imaging device that includes chains of intermediate memory cells according to embodiments.

FIG. 13 is a diagram showing sample circuits within a chain according to embodiments.

FIG. 15 is a flowchart for illustrating methods according to embodiments.

DETAILED DESCRIPTION

As has been mentioned, the present description is about imaging devices and methods. Embodiments are now described in more detail.

Figure 1:
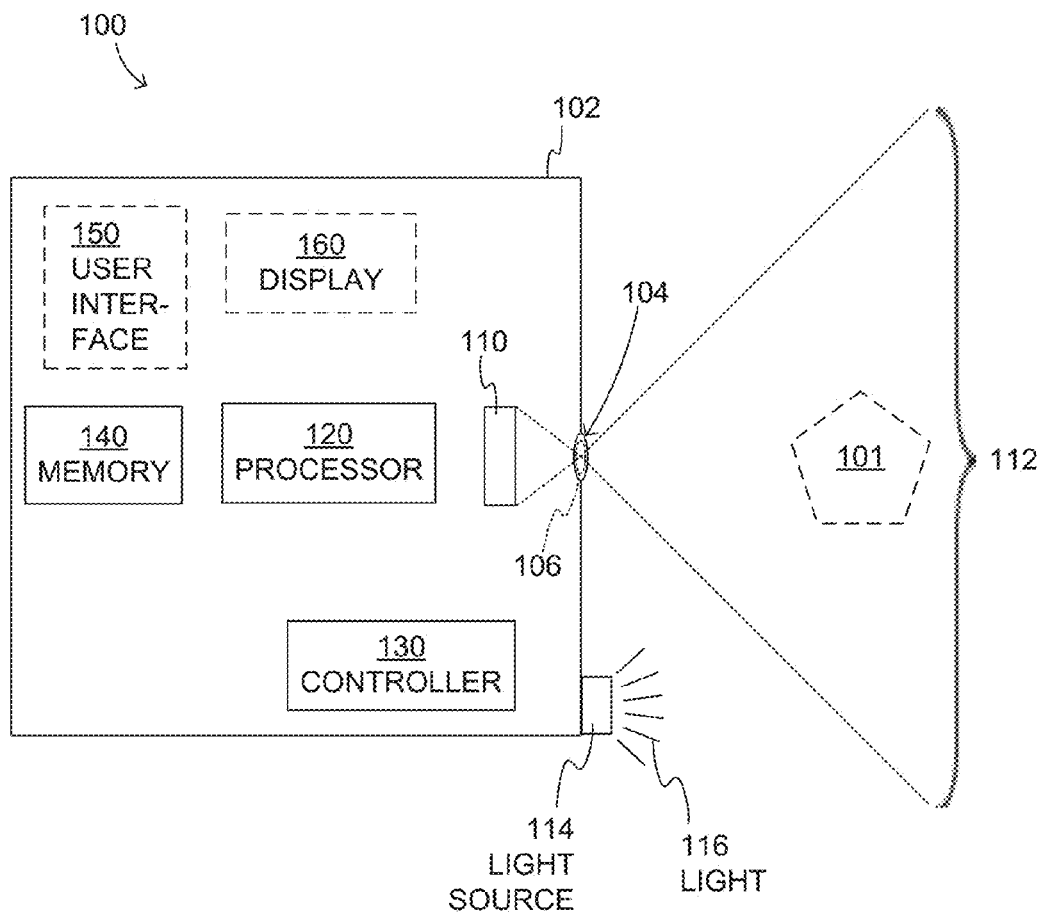
FIG. 1 is a block diagram of a sample device made according to embodiments.

FIG. 1 is a block diagram of a device 100, which can be implemented according to many different embodiments. Device 100 could have many embodiments. For example, device 100 may be an imaging device, configured to capture an image of an object 101. For another example, device 100 may be a ranging device, configured to determine a distance of object 101 from device 100. That distance is also called the range. In some embodiments, device 100 is both an imaging device and a ranging device.

Device 100 can have a casing 102 that can also be called a housing. An opening 104 is provided in casing 102. A lens 106 may be provided optionally at opening 104. Device 100 also has a pixel array 110. Pixel array 110 is configured to receive light through opening 104, and capture it. Accordingly, pixel array 110, opening 104 and lens 106 define a field of view 112. Of course, field of view 112 and object 101 are in three dimensions, while FIG. 1 shows them in two dimensions.

Casing 102 can be aligned, so that object 101, or a person or a scene as desired, will be brought within field of view 112, so that it presents an input image. A light source 114, such as an LED, may be further provided on casing 102, so as to assist in the imaging and/or ranging operation of device 100. Light source 114 can be configured to transmit light 116 towards field of view 112, so as to illuminate persons and objects within it. Light 116 can be reflected by object 101 and then be received via opening 104, in addition to ambient light received by reflection from object 101. Accordingly, light source 114 can assist in imaging by illuminating object 101 better. Or, light source 114 can assist in ranging by modulating transmitted light 116 in a way that is already known to device 100. Light source 114 may be operating responsive to a drive signal, and thus it may modulate transmitted light 116 similarly to how the drive signal is modulated.

As mentioned above, pixel array 110 can capture light received via opening 104. More particularly, in many embodiments, pixel array 110 has a two-dimensional array of pixels, which are also sometimes known as sensors. The pixels can be arranged in rows and columns, although other arrangements are also possible. When the pixels are exposed to an input image, i.e. receive light from the image, they generate signals responsive to the light they receive. Typically these signals are in the form of electric charges, which are also known as photocharges. By their magnitude, these signals encode individual sensed values for the light, which is why they are also called samples. The samples may be processed at various stages and change form, for example become digitized, etc. Taken together, the samples may render an output image that is a version of the sensed input image. This is also why the entire pixel array 110 is sometimes called an image sensor.

Device 100 may additionally include a processor 120. Processor 120 may perform image processing functions upon receiving the signals or samples from pixel array 110. Processor 120 may also perform additional functions, for example adjust imaging parameters of the samples, of the exposure, etc.

Device 100 may further include a controller 130, which can be configured to control the operation of pixel array 110 and other components of device 100. In some embodiments, controller 130 receives inputs from processor 120. Processor 120 and/or controller 130 can be implemented with one or more Central Processing Units (CPUs), digital signal processors, microprocessors, microcontrollers, application-specific integrated circuits (ASICs), programmable logic devices (PLDs), and so on. Controller 130 may optionally be formed integrally with pixel array 110, processor 120, and possibly also with other components of device 100, perhaps in a single integrated circuit. Controller 130 may control and operate pixel array 110, by transmitting control signals from output ports, and so on, as will be understood by those skilled in the art.

Device 100 may further include a memory 140. The samples can be stored in memory 140, preferably as digital values representing the signals generated by the pixels. The samples may be further processed before and/or after being stored in memory 140. In embodiments, memory 140 is configured to store final samples computed by processor 120 as the output image.

Device 100 may moreover include a user interface 150, which can be configured to receive inputs from the user. The inputs can be for controlling the operation of device 100, such as for adjusting imaging parameters and/or image processing parameters. In some embodiments, interface 150 is implemented by one or more standalone components, such as actuators, buttons, circular wheels and the like on casing 102.

Optionally, device 100 also includes a display 160, which can be considered to be part of user interface 150. Display 160 can include a screen. When provided, display 160 can display the samples as the rendered image. A user can view this image, and use it to better align casing 102, so that object 101 will be placed within field of view 112. Moreover, a user may decide to adjust imaging parameters and/or image processing parameters while receiving feedback from the image displayed in display 160. The screen of display 160 can be a touchscreen, through which inputs can be received by the user.

Figure 2:
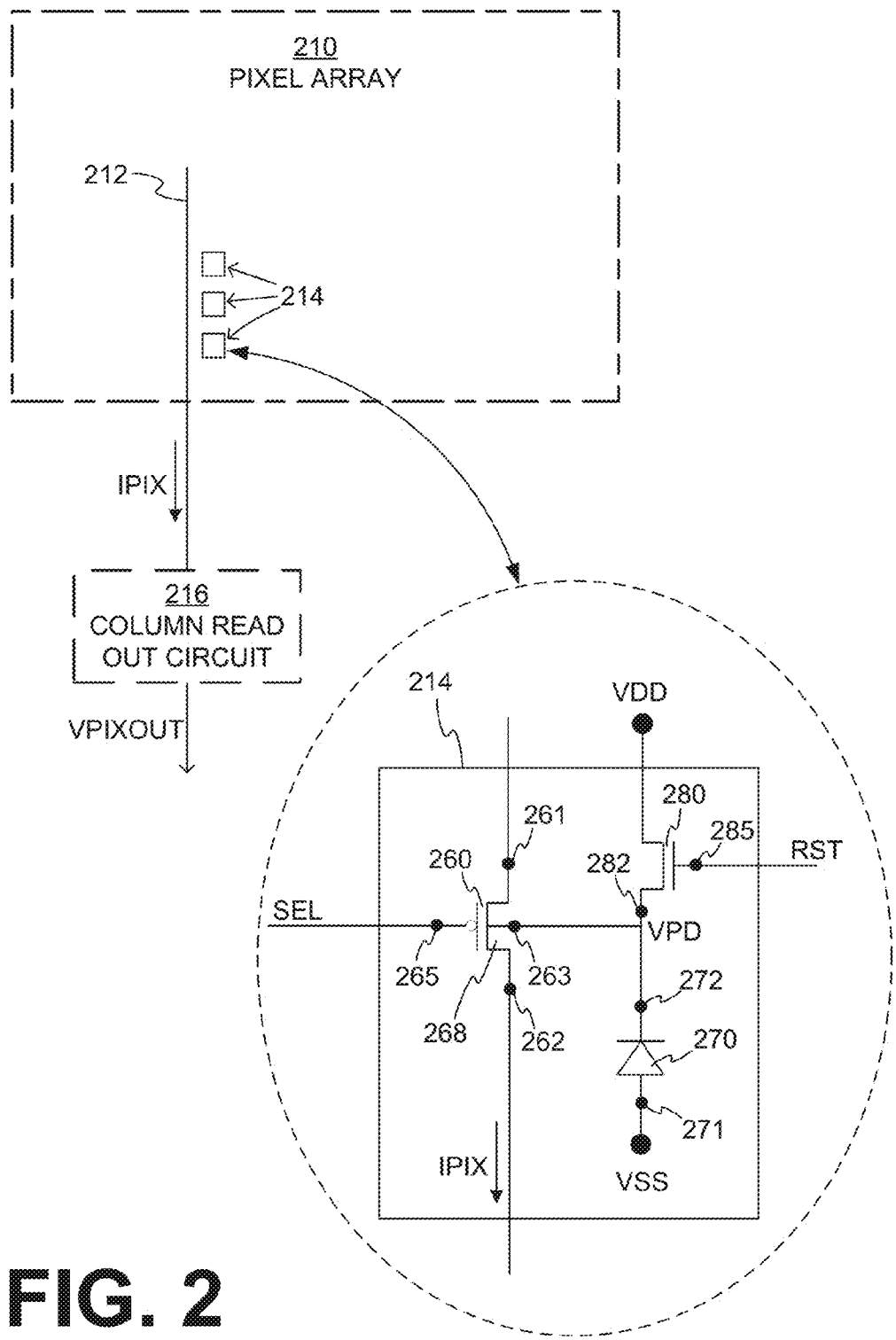
FIG. 2 is a composite diagram of a sample pixel array and a circuit diagram of a sample pixel of the array according to embodiments.

FIG. 2 shows a sample pixel array 210, which could optionally be used for pixel array 110. Pixel array 210 includes semiconductor pixels 214 that are configured to be exposed to an image. Pixels 214 could be semiconductor pixels. In response to being exposed to the image, pixels 214 can generate respective pixel currents IPIX, as will be described below in more detail. As will be appreciated, pixels 214 can be either individual pixels, or pixels in a group that are also called subpixels, as will be seen in the example of FIG. 12.

FIG. 2 also shows a column line 212 of pixel array 210. Column line 212 can be configured to carry the pixel currents IPIX generated by pixels 214, in some instances one at a time.

FIG. 2 additionally shows a column read out circuit 216 of pixel array 210. Column read out circuit 216 can be configured to convert the carried pixel current IPIX into an output voltage VPIXOUT. Of course, pixel array 210 may have additional components.

FIG. 2 further shows a sample circuit diagram for a certain one of the pixels 214. Certain pixel 214 includes a photodiode 270. Photodiode 270 can be configured to generate charges responsive to being exposed to the image. Photodiode 270 has a first terminal 271 coupled to a VSS node, and a second terminal 272 emitting the generated charges.

Certain pixel 214 also includes a select transistor 260. Select transistor 260 may be implemented in any number of ways. For example, it can be a p-channel MOSFET, an n-channel MOSFET, and so on.

Select transistor 260 includes a bulk 268, and a bulk terminal 263 that is coupled to bulk 268 and to photodiode 270. Accordingly, select transistor 260 is coupled so as to receive in its bulk 268 the charges generated by photodiode 270. In this embodiment, therefore, bulk terminal 263 is coupled to the second terminal 272 of photodiode 270. The voltage at second terminal 272 is VPD, which is set by photodiode 270 during the exposure.

Select transistor 260 further has a first terminal 261, a second terminal 262, and a gate terminal 265. A pixel current IPIX is configured to be generated between its first terminal 261 and its second terminal 262, responsive to a select signal SEL being received at its gate terminal 265.

A magnitude of the pixel current IPIX may depend on a number of the charges received by photodiode 270 through bulk terminal 263. In other words, the magnitude of the pixel current IPIX may be modulated according to the number of the received charges. In some embodiments, a threshold of select transistor 260 is changed due to the received charges. Accordingly, the magnitude of pixel current IPIX may inform as to how much light is received by pixel 214.

Certain pixel 214 may further include a reset transistor 280. Reset transistor 280 may be implemented in any number of ways. For example, it can be an n-channel MOSFET, a p-channel MOSFET, and so on.

Reset transistor 280 may have at least one terminal 282 coupled to bulk terminal 263. Reset transistor 280 may also have a gate terminal 285 that is coupled to receive a reset signal RST. Accordingly, reset transistor 280 can be configured to reset the number of the charges in the bulk of select transistor 260, responsive to receiving reset signal RST. This way, voltage VPD may be reset due to voltage VDD.

Figure 3:
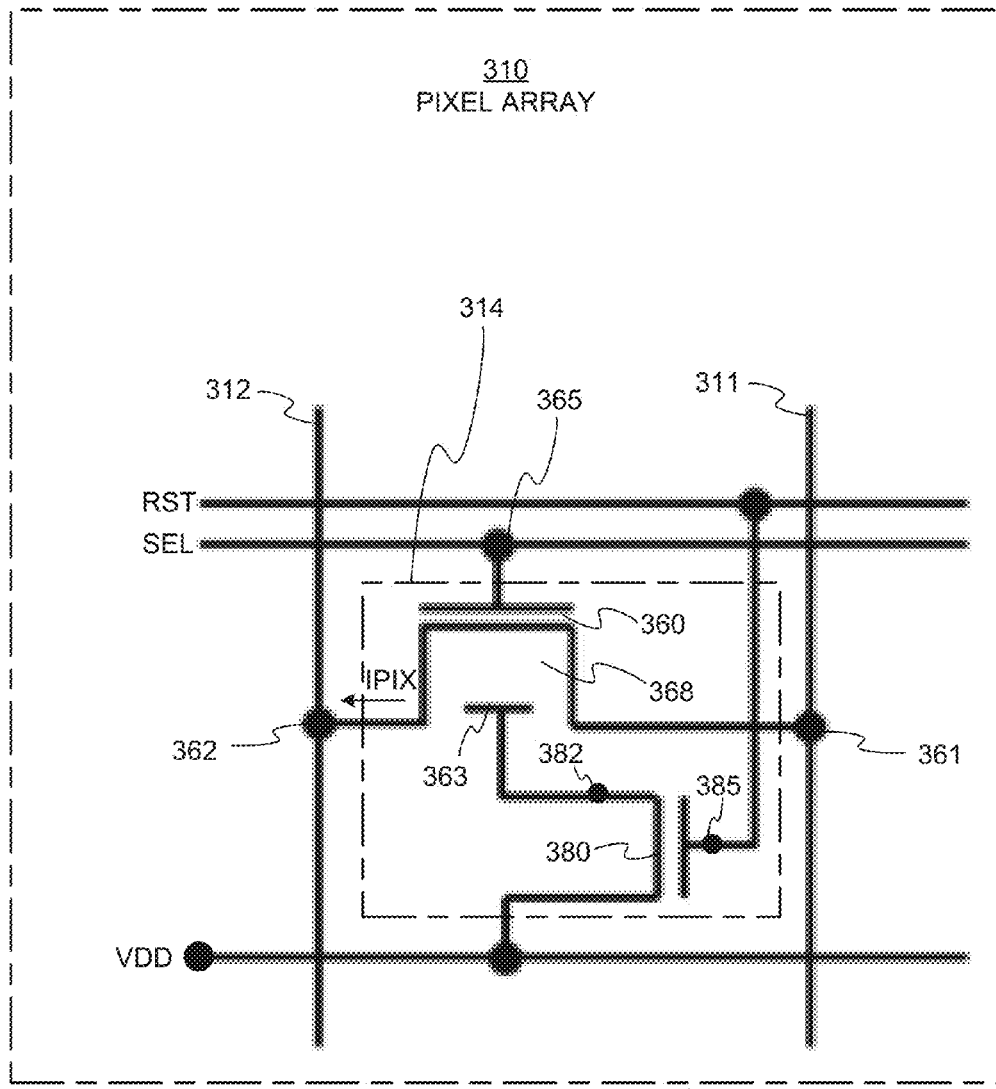
FIG. 3 shows a detail of a sample pixel array according to embodiments.

FIG. 3 shows a detail of a sample pixel array 310. Pixel array 310 could be pixel array 110 or 210. FIG. 3 also has pixels, of which a single pixel 314 is shown that emphasizes the electrical connections. Pixel 314 could be made as pixels 214 or otherwise.

For selecting and operating its pixels, pixel array 310 has a horizontal VDD line and horizontal lines with a reset (RST) and a select (SEL) signal. Pixel array 310 also has column lines 312, 311, which can carry currents IPIX generated by the pixels. Column line 311 may be coupled to a supply node, such as an appropriate VPIX, VAAPIX, etc., while column line 312 may carry the generated current IPIX for reading out.

Pixel 314 includes a photodiode that is not shown separately. Pixel 314 also includes a select transistor 360. Select transistor 360 includes a bulk 368 and a bulk terminal 363 that is coupled to bulk 368. Bulk terminal 363 is also coupled to receive charges generated by the photodiode in response to exposure to light. Select transistor 360 further has a first terminal 361, a second terminal 362, and a gate terminal 365.

When select signal SEL is received at gate terminal 365, pixel current IPIX is generated between first terminal 361 and second terminal 362. The pixel current can be sourced, for example by a supply node (not shown) via column line 311, and be output via column line 312. A magnitude of pixel current IPIX may depend on a number of the charges received by through bulk terminal 363, as mentioned above. In some embodiments, a threshold of select transistor 360 is changed due to the received charges. Accordingly, the magnitude of pixel current IPIX may inform as to how much light is received by pixel 314.

Pixel 314 further includes an optional reset transistor 380. Where a reset transistor is not provided, the pixel design is not a 2-transistor but a 1-transistor design.

Reset transistor 380 has at least one terminal 382 coupled to bulk terminal 363. Reset transistor 380 also has a gate terminal 385 that is configured to receive reset signal RST. Accordingly, reset transistor 380 can be configured to reset the number of the charges in bulk 368 of select transistor 360, responsive to receiving reset signal RST.

Pixels 214, 314 can be made in a number of ways according to embodiments. Two sample configurations are now described in more detail. In both there is PMOS sensing and NMOS resetting. The output is in the form of pixel current IPIX. Photoelectrons may be collected at PMOS bulk. The transistor threshold can be modulated by integrated photoelectrons, while the full well can be very small.

Figure 4A:
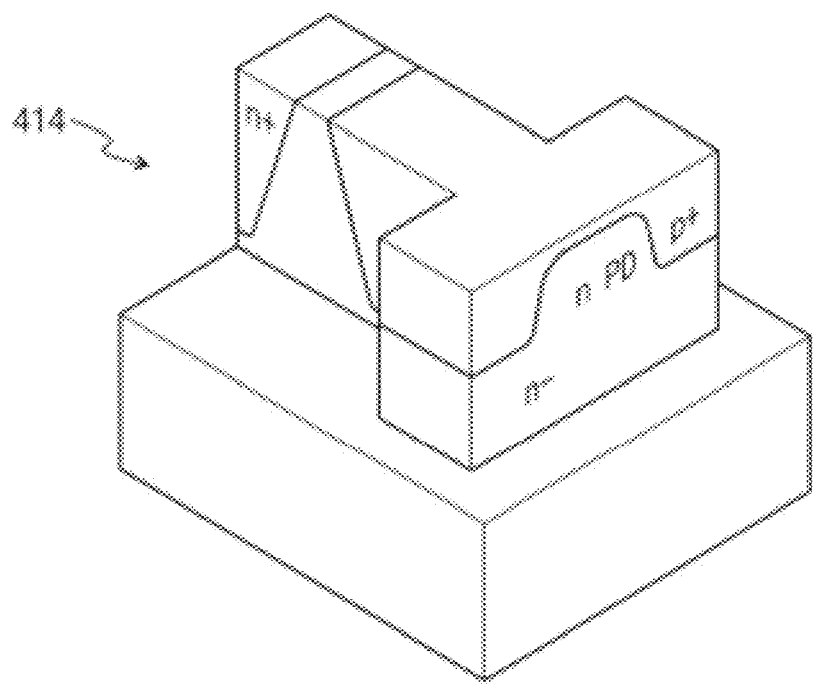
FIG. 4A is a three dimensional perspective view of a sample pixel in a rectangular configuration that could be used for a pixel in FIG. 2 or FIG. 3.
Figure 4B:
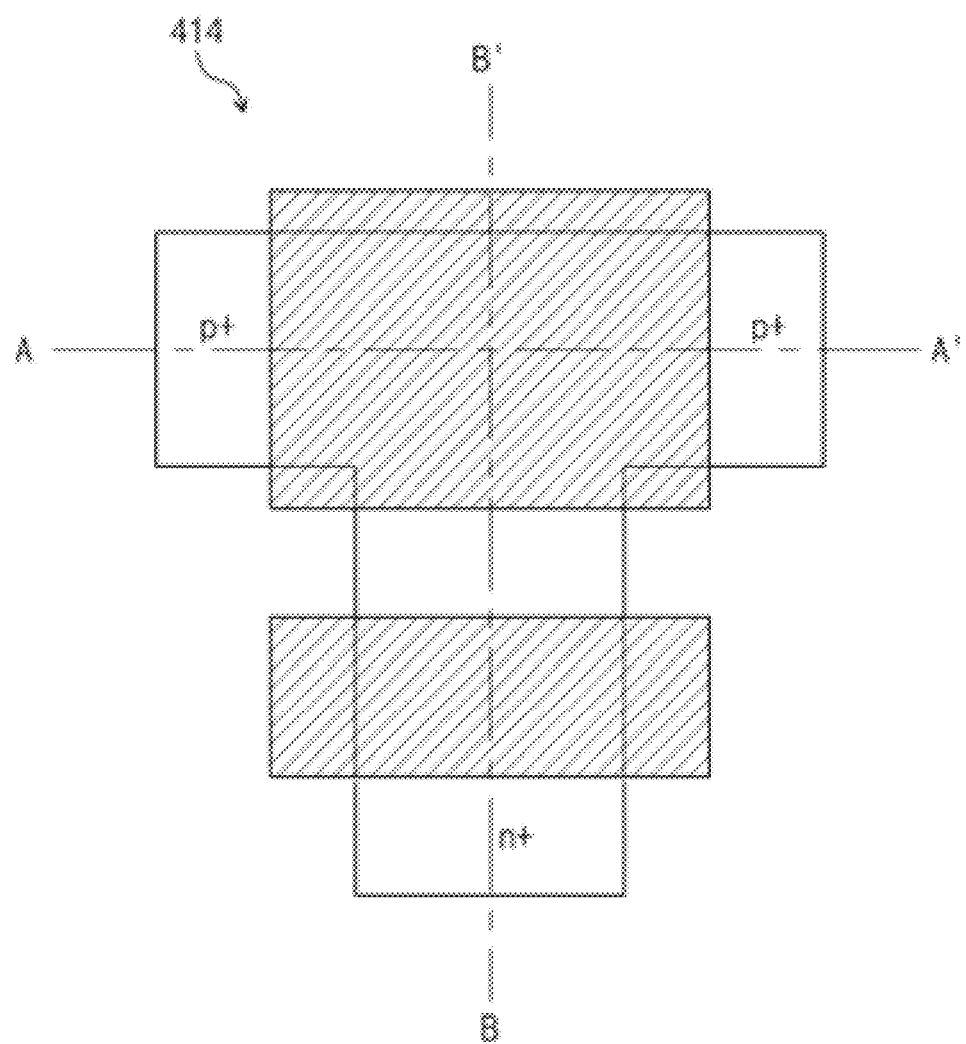
FIGS. 4B-4D are different views of the pixel of FIG. 4A.
Figure 4C:
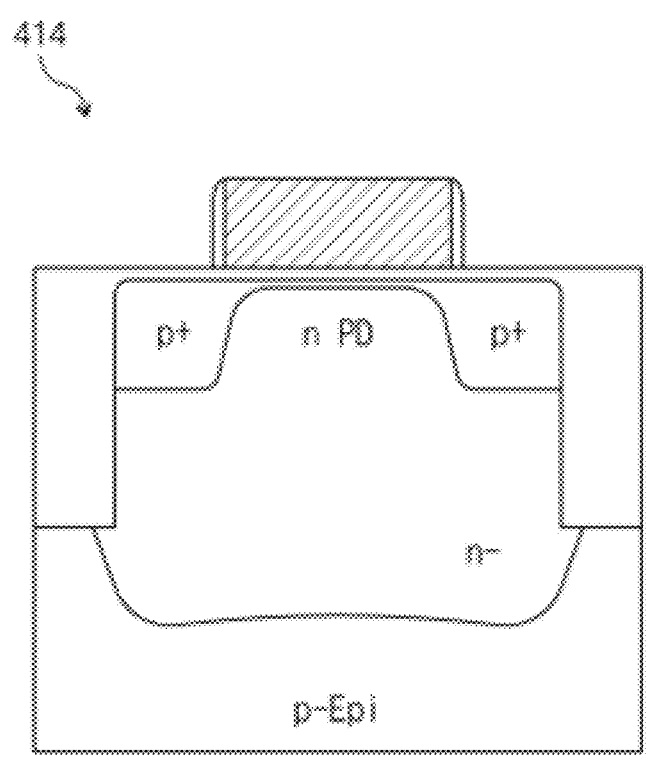
Figure 4D:
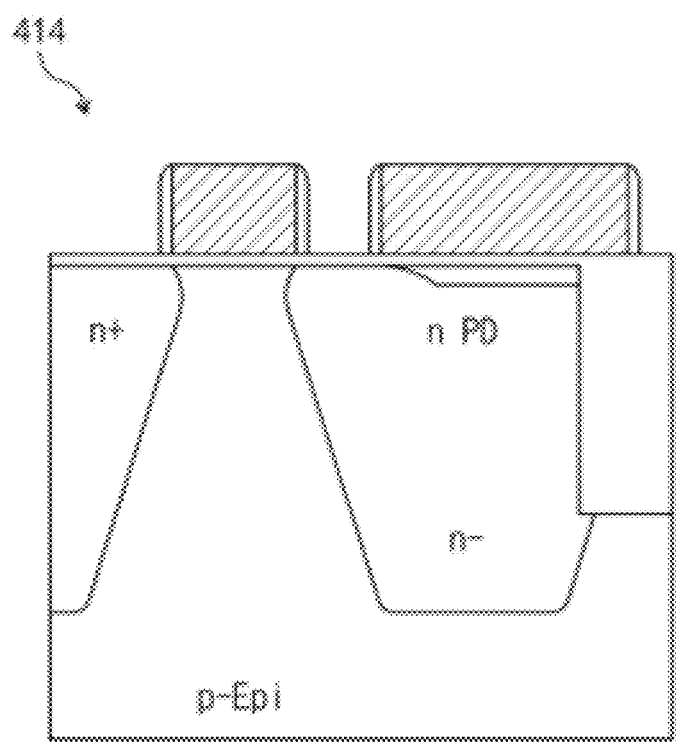

A pixel can be made with the select transistor being in a rectangular configuration, for example as seen in pixel 414 of FIG. 4A. FIG. 4B is a top view of pixel 414, where two cut lines A-A', B-B' are further shown. FIG. 4C is a cross sectional view of pixel 414 along cut line A-A', and FIG. 4D is a cross sectional view of pixel 414 along cut line B-B'.

Figure 5A:
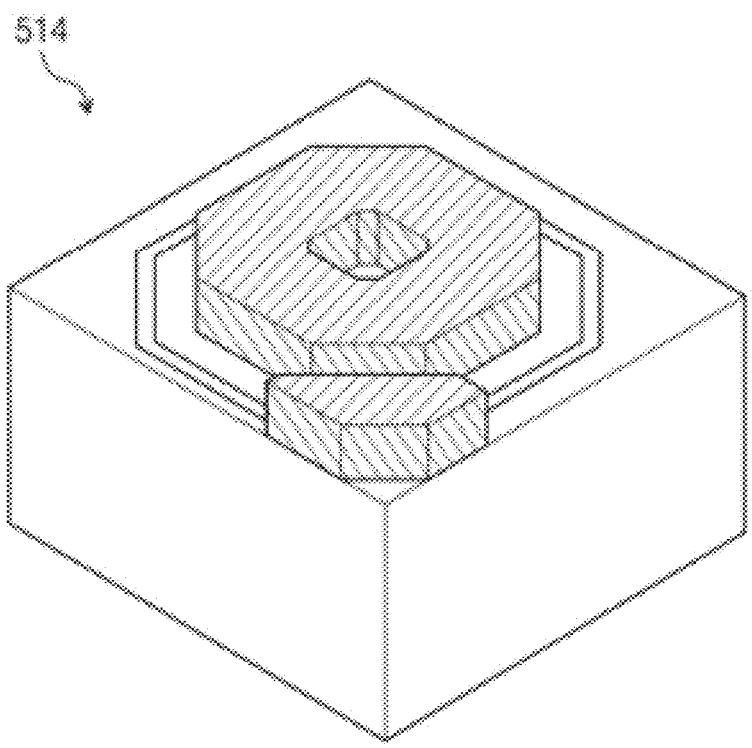
FIG. 5A is a three dimensional perspective view of a sample pixel in a ring configuration that could be used for a pixel in FIG. 2 or FIG. 3.
Figure 5B:
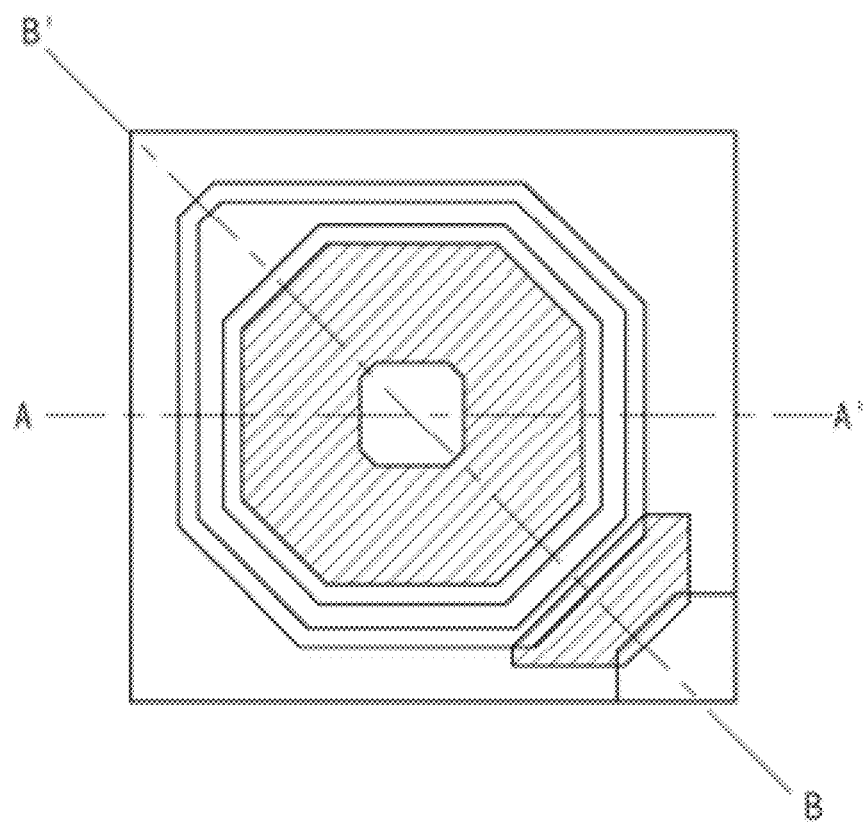
FIGS. 5B-5D are different views of the pixel of FIG. 5A.
Figure 5C:
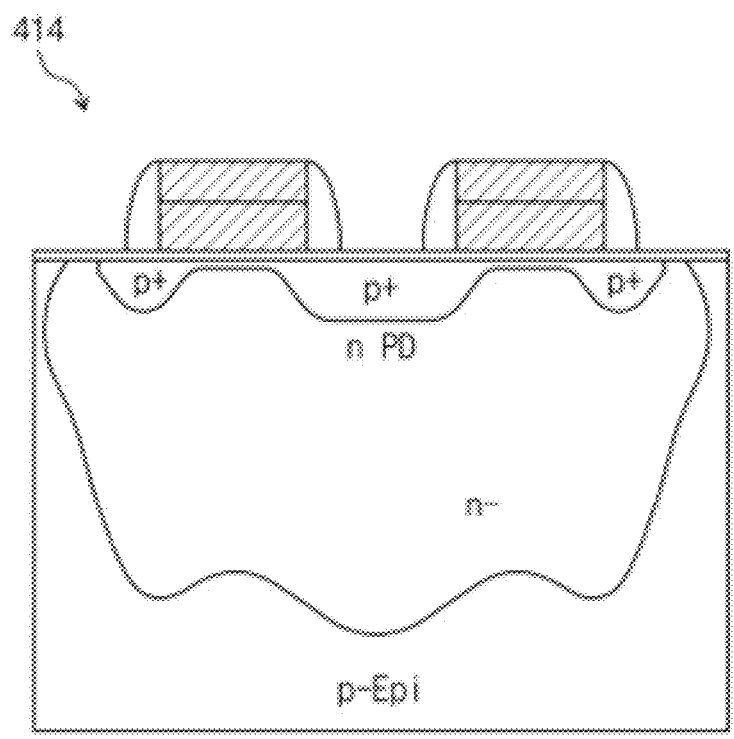
Figure 5D:
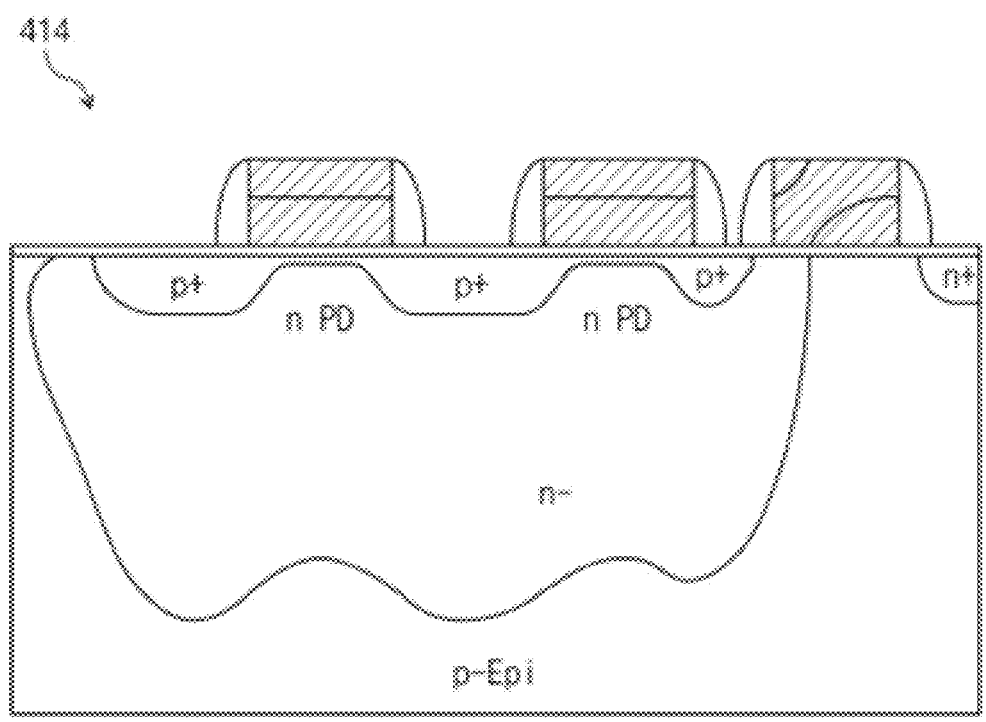

A pixel can be made with the select transistor being in a ring configuration, for example as seen in pixel 514 of FIG. 5A. FIG. 5B is a top view of pixel 514, where two cut lines A-A', B-B' are further shown. FIG. 5C is a cross sectional view of pixel 514 along cut line A-A', and FIG. 5D is a cross sectional view of pixel 514 along cut line B-B'.

Returning to FIG. 2, column read out circuit 216 can be made as is known in the art, or include a current source configured to establish a bias current, in which at least a part of the bias current is at least a part of the pixel current. Such embodiments are now described, which may be implemented with or without the pixels being as described above.

Figure 6:
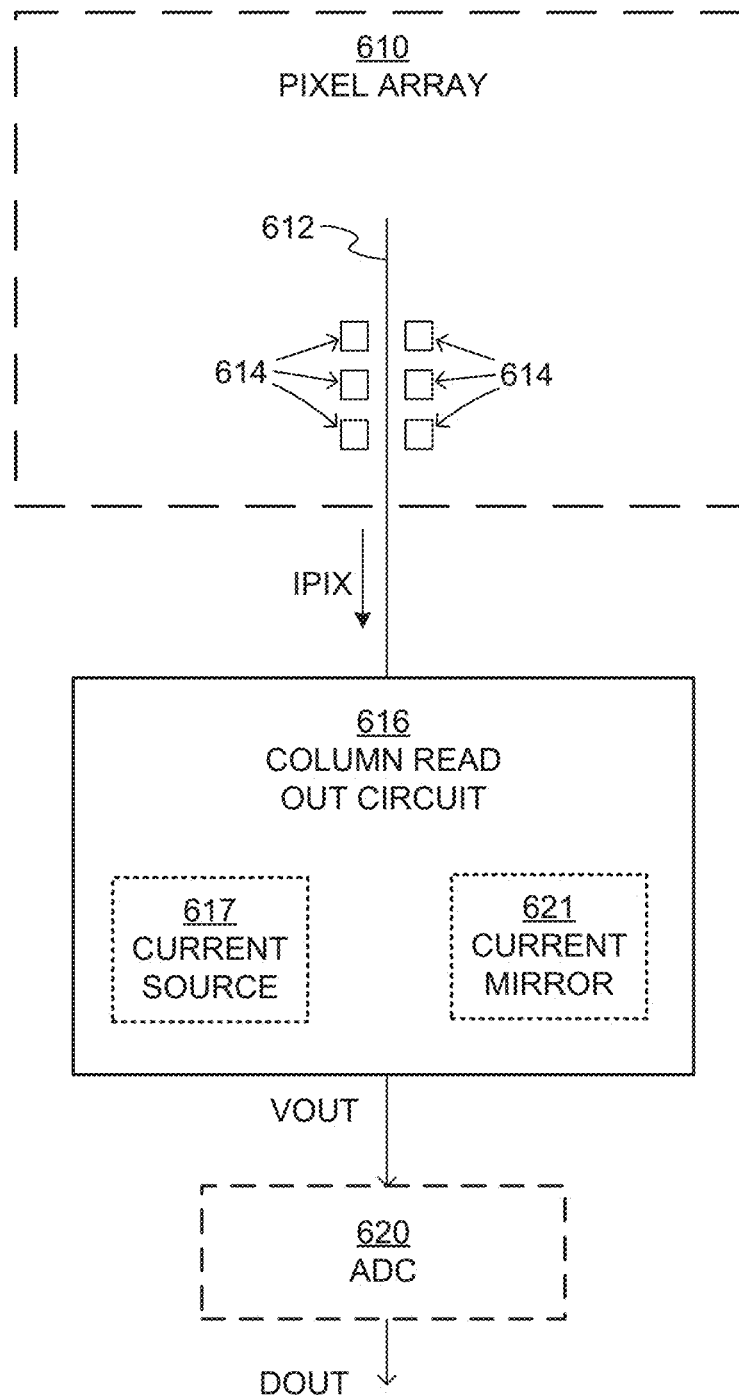
FIG. 6 is a diagram of a sample pixel array and a sample column readout circuit according to embodiments.

FIG. 6 shows a sample pixel array 610, which could optionally be used for pixel arrays 110 or 210. Pixel array 610 includes semiconductor pixels 614 that are configured to be exposed to an image, and more particularly to light received from the image during the exposure. In some embodiments, this light has a wavelength between 400 nm and 1 mm. This wavelength substantially includes the visible and infrared portion of the electromagnetic spectrum. At least a certain one, and preferably more than one, of pixels 614 are configured to generate a pixel current IPIX upon being read out. Pixel current IPIX may have a magnitude in accordance with an amount of light received from the image by the certain pixel.

FIG. 6 also shows a column line 612 of pixel array 610. Column line 612 can be configured to carry the generated pixel current IPIX. Column line 612 may further carry the generated pixel currents from others of the pixels, and additional column lines may be provided, but are not shown so as to not clutter the drawing.

FIG. 6 additionally shows a column read out circuit 616 of pixel array 610. Column read out circuit 616 can be configured to convert the pixel current IPIX that is carried by column line 612 into an output voltage VOUT. In some instances, an intermediate pixel voltage Vint or VPIXOUT is generated before generating output voltage VOUT.

In embodiments, output voltage VOUT is provided as an analog voltage, and column read out circuit 616 may further include an Analog to Digital Converter (ADC) 620, which sometimes is called column ADC. ADC 620 can be configured to convert the pixel's output voltage VOUT into a digital output voltage DOUT. ADC 620 can be made in a number of ways, for example using single slope, successive-approximation-register (SAR), sigma-delta, etc.

In embodiments, column read out circuit 616 includes a current source 617. Current source 617 can be configured to establish a bias current. In such embodiments, column read out circuit 616 may further include a current mirror 621 that is configured to generate a mirrored bias current from the bias current.

Column read out circuit 616 may have current-based embodiments and voltage based embodiments. More particular examples are now described.

In some current-based embodiments, column read out circuit 616 further includes a conversion circuit that is configured to generate the output voltage from an offset current. The offset current can be generated by a difference between the mirrored bias current and the pixel current IPIX. In some of these embodiments, column read out circuit 616 further includes a subtraction node, and the offset current can be generated at the subtraction node.

Figure 7A:
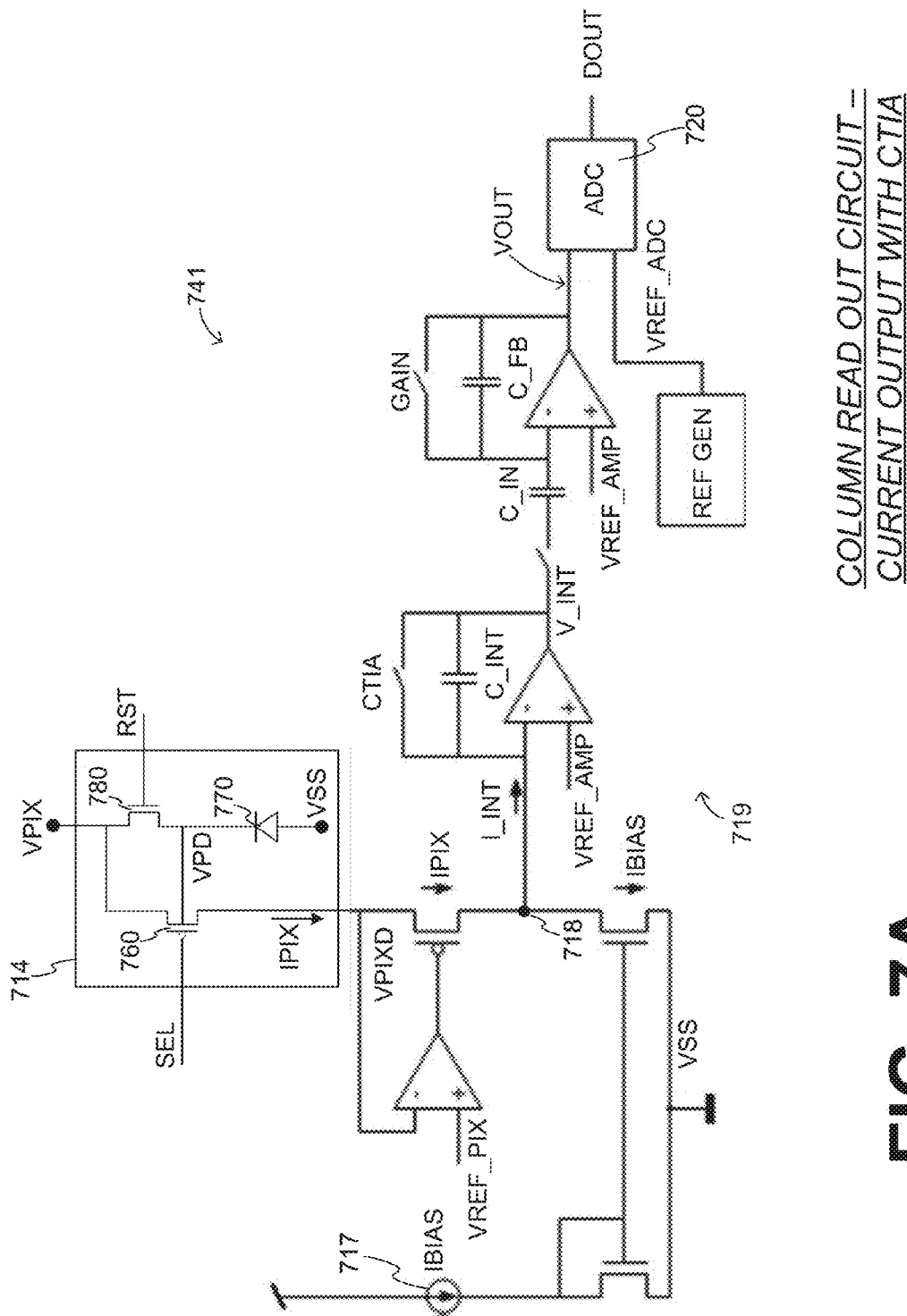
FIG. 7A is a diagram of a sample circuit according to embodiments.

FIG. 7A shows a circuit 741, and FIG. 7B shows equations that apply to circuit 741. Circuit 741 includes a sample pixel 714, an ADC 720, and a column readout circuit that has a current source 717, a current mirror, a subtraction node 718, a conversion circuit 719 and other components.

Pixel 714 includes a select transistor 760, a photodiode 770, and a reset transistor 780, arranged as discussed previously. Pixel current IPIX in this case is generated from the drain of select transistor 760, and thus can be also called a drain current. While pixel 714 works, other pixel designs may be substituted in circuit 741.

In operation, drain current IPIX can be modulated by the body effect of select transistor 760. The body effect is given by Equation 7-1, and the current output IPIX in the triode region is given by Equation 7-2. An offset current I_INT is generated at subtraction node 718, and its value is given by Equation 7-3.

In the embodiment of FIG. 7A, conversion circuit 719 includes a capacitive transimpedance amplifier (CTIA), which effectuates integration to generate an intermediate voltage Vint. The value of Vint is given by Equation 7-4. Intermediate voltage Vint is amplified, in order to generate output voltage VOUT. The gain of the amplification can be given by the ratio of two capacitances, as seen in Equation 7-5.

Figure 8A:
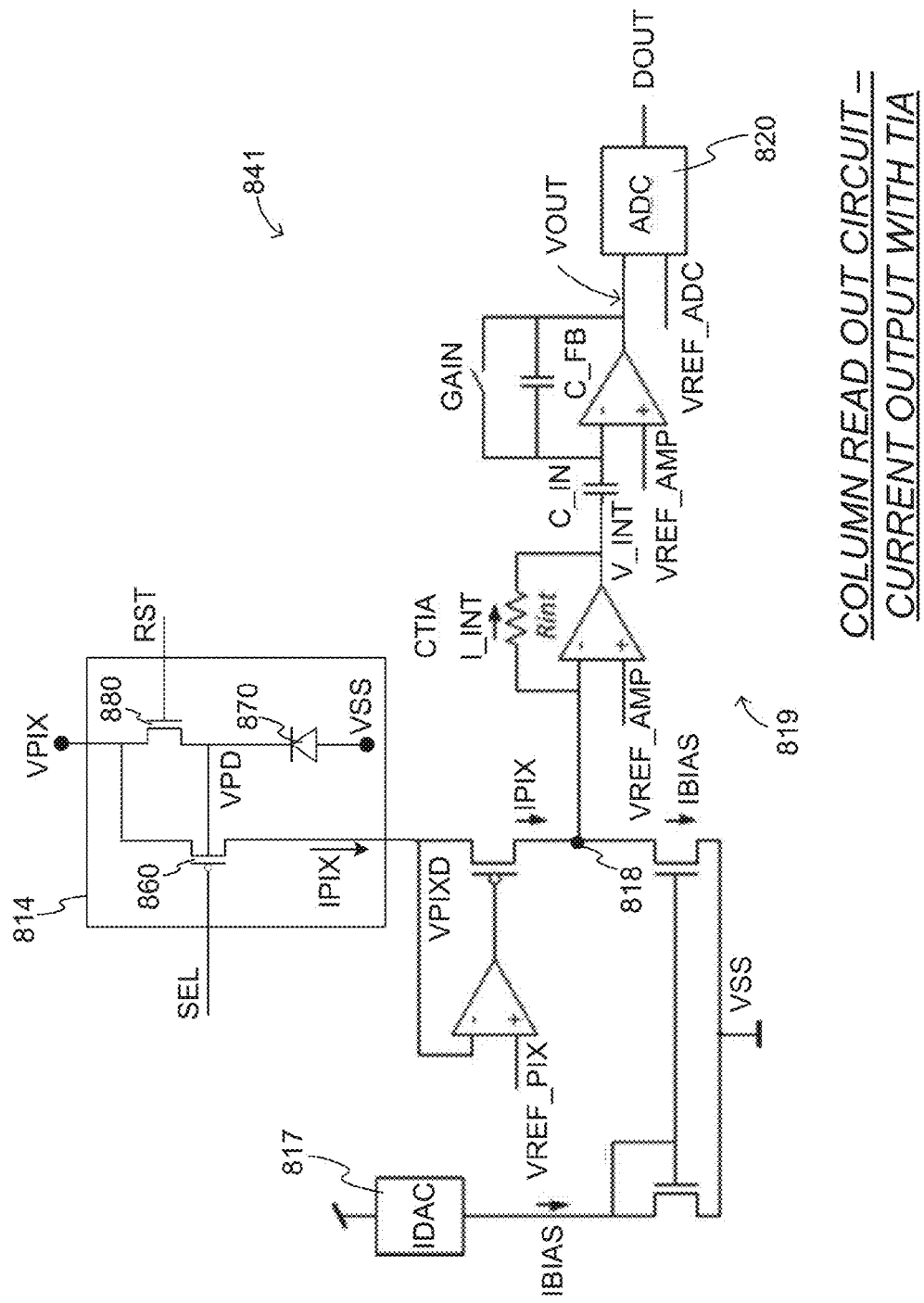
FIG. 8A is a diagram of a sample circuit according to embodiments.

FIG. 8A shows a circuit 841, and FIG. 8B shows equations that apply to circuit 841. Circuit 841 includes a sample pixel 814, an ADC 820, and a column readout circuit that has a current source IDAC 817, a current mirror, a subtraction node 818, a conversion circuit 819 and other components.

Pixel 814 includes a select transistor 860, a photodiode 870, and a reset transistor 880, arranged as discussed previously. Pixel current IPIX is generated from the drain of select transistor 860, and thus can be also called a drain current. While pixel 814 works, other pixel designs may be substituted in circuit 841.

In operation, drain current IPIX is modulated by the body effect of select transistor 860. The body effect is given by Equation 8-1, and the current output IPIX in the triode region is given by Equation 8-2. An offset current I_INT is generated at subtraction node 818, and its value is given by Equation 8-3.

In the embodiment of FIG. 8A, conversion circuit 819 includes a transimpedance amplifier (TIA), which effectuates current to voltage conversion to generate an intermediate voltage Vint. The value of Vint is given by Equation 8-4. Intermediate voltage Vint is amplified, in order to generate output voltage VOUT. The gain of the amplification can be given by the ratio of two capacitances, as seen in Equation 8-5.

Returning to FIG. 6, in some voltage-based embodiments, in column read out circuit 616, the certain pixel shares a joinder node with current mirror 621. In such embodiments, the mirrored bias current can be substantially the pixel current, and pass through the joinder node. The output voltage VPIXOUT may be generated on the joinder node. Examples are now described.

Figure 9A:
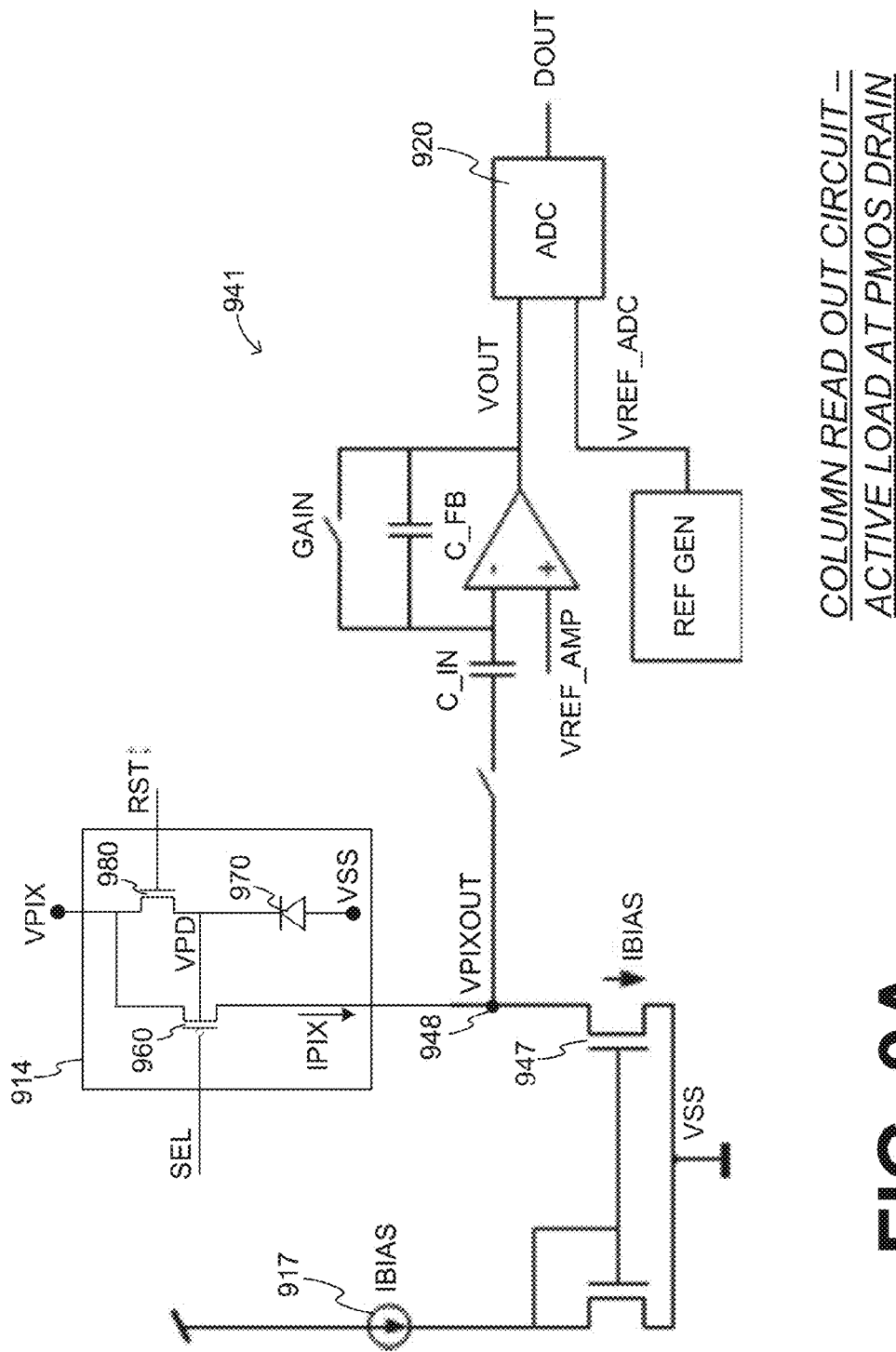
FIG. 9A is a diagram of a sample circuit according to embodiments.

FIG. 9A shows a circuit 941, and FIG. 9B shows equations that apply to circuit 941. Circuit 941 includes a sample pixel 914, an ADC 920, and a column readout circuit that has a current source 917, a current mirror that includes FET 947, a joinder node 948, and other components.

Pixel 914 includes a select transistor 960, a photodiode 970, and a reset transistor 980, arranged as discussed previously. Pixel current IPIX is generated from the drain of select transistor 960, and thus can be also called a drain current. While pixel 914 works, other pixel designs may be substituted in circuit 941.

In operation, drain current IPIX can be modulated by the body effect of select transistor 960. The body effect is given by Equation 9-1, and the current output IPIX in the triode region is given by Equation 9-2.

In the embodiment of FIG. 9A, pixel 914 includes a PMOS drain of select transistor 960, and joinder node 948 is the PMOS drain. Output voltage VPIXOUT of the pixel is generated at joinder node 948. Output voltage VPIXOUT is thus derived from a current to voltage conversion from the resistance of FET 947, and its value is given by Equation 9-3.

Pixel voltage VPIXOUT is amplified, in order to generate output voltage VOUT. The value of VOUT is given by Equation 9-4, where the gain is the ratio of two capacitances.

Figure 10A:
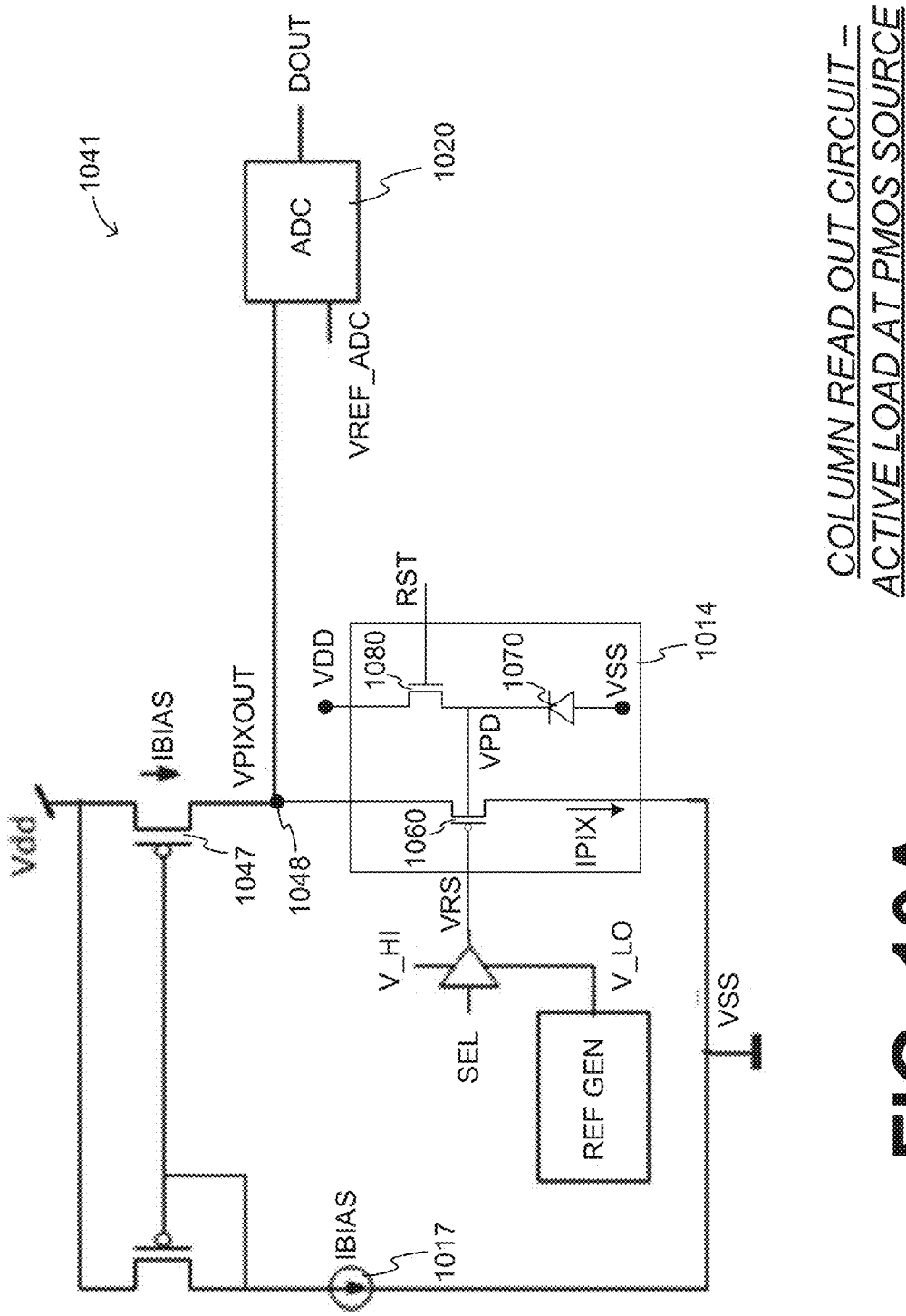
FIG. 10A is a diagram of a sample circuit according to embodiments.

FIG. 10A shows a circuit 1041, and FIG. 10B shows equations that apply to circuit 1041. Circuit 1041 includes a sample pixel 1014, an ADC 1020, and a column readout circuit that has a current source 1017, a current mirror that includes FET 1047, a joinder node 1048, and other components.

Pixel 1014 includes a select transistor 1060, a photodiode 1070, and a reset transistor 1080. Pixel current IPIX is drawn from the source of select transistor 1060. While pixel 1014 works, other pixel designs may be substituted in circuit 1041.

In operation, the threshold of select transistor 1060 can be changed due to the body effect. The body effect is given by Equation 10-1.

In the embodiment of FIG. 10A, pixel 1014 includes a PMOS source of select transistor 1060, and joinder node 1048 is the PMOS source. Output voltage VPIXOUT of pixel 1014 is generated at joinder node 1048. Its value in the saturation region is given by Equation 10-2. Equation 10-3 describes a ratio of differential changes.

Embodiments can be used for fast readout in contexts where there are many pixels, for example subpixels, etc. Additional examples are now described.

FIG. 11 is a diagram of sample components of an imaging device, which include a pixel array 1110. Pixel array 1110 has pixels 1114 that are configured to acquire respective samples of an image. Sometimes only a few of these pixels 1114 are considered, for example a first pixel, a second, a third, a fourth, etc., along with the respective samples of the image that these pixels acquire upon exposure.

FIG. 11 also shows a column 1112, and a column read out circuit 1116. Column read out circuit 1116 may be made as is known in the art, or according to embodiments described in this document. Accordingly, column read out circuit 1116 renders pixel values VPIXOUTn, where n can take values 0, 1, 2, 3 to designates the first, second, third, fourth, etc. samples that have been acquired by the respective first, second, third, fourth, etc. pixels.

FIG. 11 additionally shows an Analog to Digital Converter (ADC) 1120, which can be made as ADC 620. Accordingly, ADC 1120 can be configured to digitize the first, second, third, fourth, etc., acquired samples. These digitized samples can be designated as DOUTn.

FIG. 11 further shows a first chain 1190. In the example of FIG. 11, first chain 1190 has, moving upwards from the bottom, a first intermediate memory cell 1191, a second intermediate memory cell 1192, a third intermediate memory cell 1193 and a fourth intermediate memory cell 1194. Intermediate memory cells 1191, 1192, 1193 and 1194 can be configured to finally store respectively the digitized first, second, third and fourth samples DOUT0, DOUT1, DOUT2, and DOUT3. This final storing is different from temporary storing that may be performed before the final storing is settled, as is explained later in more detail.

An additional component in FIG. 11 is a senseamp array 1134 and a module 1135. Senseamp array 1134 may read memory outputs DOUT0, DOUT1, DOUT2, DOUT3, and prepare them for module 1135.

Module 1135 could be, for example, a processor like processor 120, a memory like memory 140, even a display like display 160. Module 1135 may have input nodes INP0, INP1, INP2, INP3. Module 1135 may be configured to input the finally stored samples DOUT0, DOUT1, DOUT2, DOUT3 from intermediate memory cells 1191, 1192, 1193 and 1194 in input nodes INP0, INP1, INP2, INP3. In some embodiments, the finally stored samples DOUT0, DOUT1, DOUT2, DOUT3 are input in module 1135 concurrently, although this is not necessary. Once input in module 1135, samples DOUT0, DOUT1, DOUT2, DOUT3 may be stored, displayed, processed, and so on. Module 1135 can be configured to process inputted samples DOUT0, DOUT1, DOUT2, DOUT3 in a number of ways, for example convolve them with a kernel, add them together for the context of subpixels, and so on.

FIG. 12 is another diagram of sample components of an imaging device according to embodiments. It will be appreciated that FIG. 12 shows more detail about chains, but does not show module 1135 as FIG. 11 does.

FIG. 12 shows a pixel array 1210 having pixels 1214. Not all pixels are shown, so as not to clutter the drawing. In the example of FIG. 12, pixels 1214 are organized in groups of four, the pixels being individually labeled 0, 1, 2, 3. A sample group 1215 is indicated. As such, pixels 1214 can be individually treated as subpixels, for example 2×2 for a single pixel. FIG. 12 also shows row drivers 1232 for generating control signals for the pixel groups.

FIG. 12 does no show column read out circuits, which may or may not be included. Pixel output voltages VPIXOUT encode the acquired samples.

FIG. 12 also shows ADCs 1220. In the example of FIG. 12, one ADC 1220 is included for each column, coupled to receive pixel output voltages VPIXOUT. A sample column 1212 is denoted. Not all ADCs 1220 are shown, so as not to clutter the drawing. ADCs 1220 can be made as ADC 1120. ADCs 1220 can be configured to digitize the acquired samples, and the outputs are designated as DOUT. For example, a second ADC can be configured to digitize a third and a fourth acquired samples that are not digitized by a first ADC, etc.

FIG. 12 further shows chains 1290. In the example of FIG. 12, one chain 1290 is given for each column, coupled after a respective ADC 1220. Not all chains 1290 are shown, so as not to clutter the drawing. Chains can be made similarly to each other. In other, similar embodiments, a second chain can have a third and a fourth intermediate memory cells that are configured to finally store respectively digitized third and fourth samples that are not finally stored in intermediate memory cells of a first chain, etc.

FIG. 12 moreover shows a cross line MOUT. This is a line configured to deliver to the module (not shown) the finally stored samples (DOUT0, DOUT1, . . . ) from ultimately different columns. Different columns may be selected by a SELCOL signal. Accordingly, a finally stored first sample from the first chain may be so delivered, or a finally stored third sample from a second chain, and so on. In normal reading out, the SELCOL signal may step through all the columns, for example sequentially. This may also be coordinated with exposure patterns, and so on.

Returning to FIG. 11, intermediate memory cells 1191, 1192, 1193 and 1194 are now described in more detail. These are 1-bit cells. If the ADC outputs more than one bit, more memory cells are required.

In embodiments, these cells are daisy-chained. In other words, a value may become stored in intermediate memory cell 1191 by passing through intermediate memory cells 1194, 1193, 1192 in order, as if by cascading down. To better illustrate this effect, arrows are shown between intermediate memory cells 1194, 1193, 1192 and 1191, although the diagram is not intended to be a flowchart. Accordingly, digitized first sample DOUT0 can be finally stored in intermediate memory cell 1191 by being temporarily stored in intermediate memory cell 1192, and so on. The purpose of using daisy chain is to reduce the vertical connections in column layout, and to make it work for small pixels or small subpixels.

Chains according to embodiments are now described in more detail.

FIG. 13 is a diagram showing two sample chains 1390. The one on the left is shown in more detail, and includes four intermediate memory cells 1391, 1392, 1393, 1394, each of which is a 1-bit latch made from two inverters coupled front-to-back, therefore storing a logical 0 or a logical 1.

Across each of latches 1391, 1392, 1393, 1394 there are two cross lines Moutn+ and Moutn−. For reading out the finally stored data in each chain 1390, a select column signal SELCOL can cause the latches to become coupled to their respective cross lines Moutn+ and Moutn−. This way, for example, four subpixels can be read together.

Chain 1390 further has pass gates 1381, 1382, 1383, 1384. These can be configured to control access to respective intermediate memory cells 1391, 1392, 1393, 1394. In this example, pass gates 1381, 1382, 1383, 1384 are inverters, which work very well with the 1-bit latches for cascading.

Chains 1390 may receive digitized samples DOUTn, where n=0, 1, 2, 3. Write control signals Wr0, Wr1, Wr2, Wr3, can control respectively pass gates 1381, 1382, 1383, 1384, and therefore can control whether cascading and final storing is permitted for intermediate memory cell 1391, or 1392, or 1393, or 1394.

Figure 14:
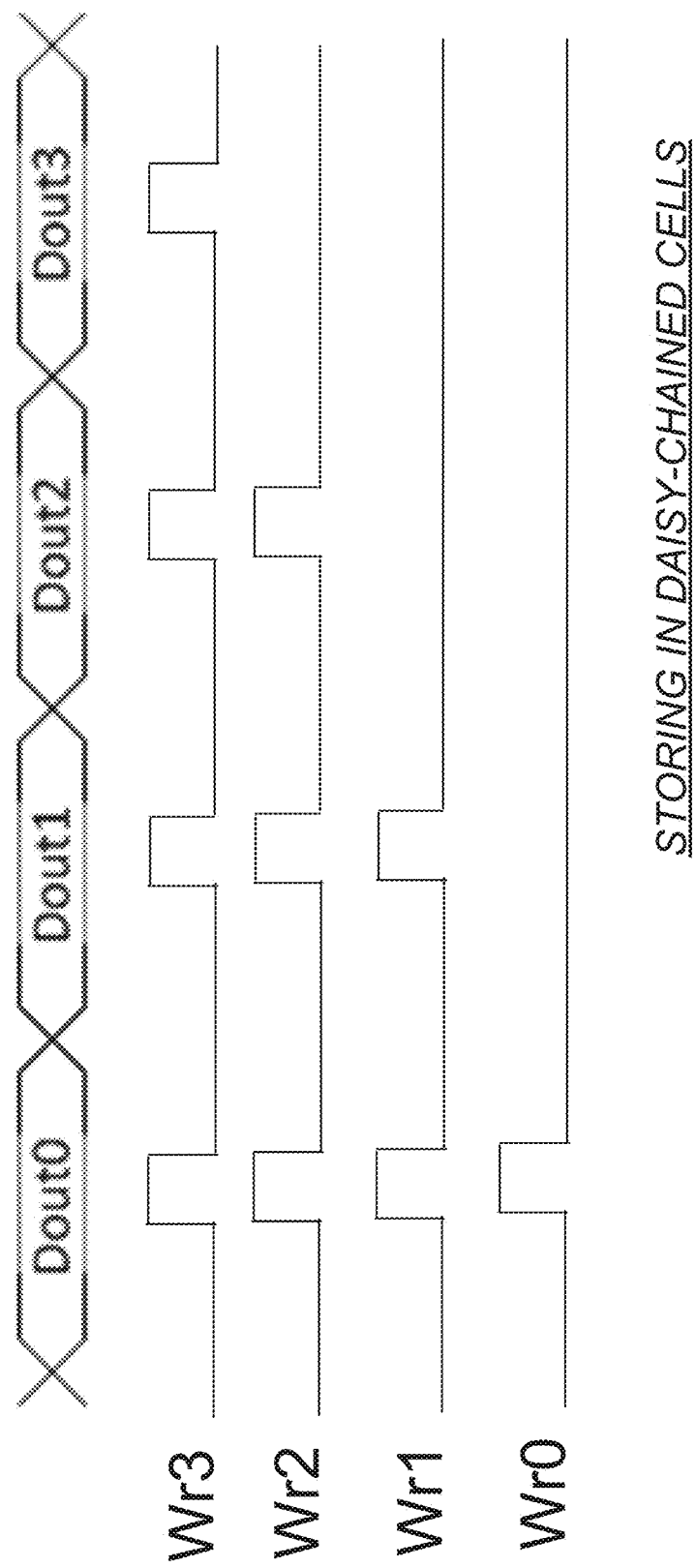
FIG. 14 is a time diagram of sample write control signals that may be used for storing data in the intermediate memory cells of FIG. 13 according to embodiments.

FIG. 14 is a time diagram. The top row indicates which of signals DOUTn read out from the array is available for storing in intermediate memory cells 1391, 1392, 1393, 1394. The other rows indicate which pass gates are enabled at the time by write control signals Wr0, Wr1, Wr2, Wr3.

When DOUT0 is available, all write control signals Wr0, Wr1, Wr2, Wr3 enable all four pass gates 1381, 1382, 1383, 1384 to permit access to all intermediate memory cells 1391, 1392, 1393, 1394. Accordingly, DOUT0 becomes temporarily stored in cells 1394, 1393, 1392 and finally stored in cell 1391.

When DOUT1 becomes available, write control signal Wr0 disables pass gate 1381. Accordingly, cell 1391 retains its stored value, while the other cells 1392, 1393, 1394 are written. Similarly, when DOUT2 becomes available, write control signal Wr1 disables pass gate 1382. Accordingly, third sample DOUT2 becomes temporarily stored in fourth intermediate memory cell 1394, and so on.

FIG. 15 shows a flowchart 1500 for describing methods according to embodiments. The methods of flowchart 1500 may also be practiced by embodiments described elsewhere in this document.

According to an operation 1510, a first and a second sample of an image can be acquired in respectively a first and in a second pixel of a pixel array.

According to another operation 1520, the first and the second acquired samples can be digitized. Digitizing may be performed by an ADC.

According to another operation 1530, the first sample is stored temporarily in a second intermediate memory cell and finally in a first intermediate memory cell of a chain.

According to another subsequent operation 1540, the second sample is then finally stored in the second intermediate memory cell.

According to another, optional operation 1550, the finally stored first and second samples are input into a module from the first and the second intermediate memory cells. As before, inputting can be concurrent. Inputting is often concurrent when a single SELCOL signal is provided for the entire chain.

According to another, optional operation 1560, samples inputted in the module are then processed. Processing may include adding together the inputted samples, convolving the inputted samples, etc.

In the methods described above, each operation can be performed as an affirmative step of doing, or causing to happen, what is written that can take place. Such doing or causing to happen can be by the whole system or device, or just one or more components of it. In addition, the order of operations is not constrained to what is shown, and different orders may be possible according to different embodiments. Moreover, in certain embodiments, new operations may be added, or individual operations may be modified or deleted. The added operations can be, for example, from what is mentioned while primarily describing a different system, apparatus, device or method.

A person skilled in the art will be able to practice the present invention in view of this description, which is to be taken as a whole. Details have been included to provide a thorough understanding. In other instances, well-known aspects have not been described, in order to not obscure unnecessarily the present invention. Plus, any reference to any prior art in this description is not, and should not be taken as, an acknowledgement or any form of suggestion that this prior art forms parts of the common general knowledge in any country.

This description includes one or more examples, but that does not limit how the invention may be practiced. Indeed, examples or embodiments of the invention may be practiced according to what is described, or yet differently, and also in conjunction with other present or future technologies. Other embodiments include combinations and subcombinations of features described herein, including for example, embodiments that are equivalent to: providing or applying a feature in a different order than in a described embodiment; extracting an individual feature from one embodiment and inserting such feature into another embodiment; removing one or more features from an embodiment; or both removing a feature from an embodiment and adding a feature extracted from another embodiment, while providing the features incorporated in such combinations and subcombinations.

In this document, the phrases "constructed to" and/or "configured to" denote one or more actual states of construction and/or configuration that is fundamentally tied to physical characteristics of the element or feature preceding these phrases and, as such, reach well beyond merely describing an intended use. Any such elements or features can be implemented in any number of ways, as will be apparent to a person skilled in the art after reviewing the present disclosure, beyond any examples shown in this document.

The following claims define certain combinations and subcombinations of elements, features and steps or operations, which are regarded as novel and non-obvious. Additional claims for other such combinations and subcombinations may be presented in this or a related document.

What is claimed is:

1. An imaging device, comprising:
a pixel array of pixels configured to be exposed to an image, in which a certain one of the pixels includes:
a photodiode configured to generate charges responsive to being exposed to the image, and
a select transistor that has a bulk, a bulk terminal coupled to the bulk and to the photodiode so as to receive the generated charges in the bulk, a first terminal, a second terminal, and a gate terminal, and
in which a pixel current is configured to be generated between the first terminal and the second terminal responsive to a select signal being received at the gate terminal, and
a magnitude of the pixel current depends on a number of the received charges;
a column line configured to carry the generated pixel current; and
a column read out circuit configured to generate an output voltage from the carried pixel current, the column read out circuit including a current source configured to establish a bias current and a current mirror configured to generate a mirrored bias current, in which
at least a part of the mirrored bias current is at least a part of the pixel current, and
the column read out circuit further includes a conversion circuit configured to generate the output voltage from an offset current generated by a difference between the mirrored bias current and the pixel current.

2. The imaging device of claim 1, in which
a threshold of the select transistor is changed due to the received charges.

3. The imaging device of claim 1, in which
the certain pixel further includes a reset transistor having at least one terminal coupled to the bulk terminal and a gate terminal that is coupled to receive a reset signal.

4. The imaging device of claim 1, in which
the select transistor is in a rectangular configuration.

5. The imaging device of claim 1, in which
the select transistor is in a ring configuration.

6. The imaging device of claim 1, in which
the column read out circuit further includes a subtraction node, and
the offset current is generated at the subtraction node.

7. The imaging device of claim 1, in which
the certain pixel shares a joinder node with the current mirror,
the mirrored bias current is substantially the pixel current and passes through the joinder node, and
the output voltage is generated on the joinder node.

* * * * *